(12) United States Patent
Fukuda et al.

(10) Patent No.: US 6,894,287 B2
(45) Date of Patent: May 17, 2005

(54) MICROFABRICATION APPARATUS AND MICROFABRICATION METHOD

(75) Inventors: Muneyuki Fukuda, Kokubunji (JP); Satoshi Tomimatsu, Kokubunji (JP); Hiroyasu Shichi, Tokyo (JP); Osamu Watanabe, Hachioji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 32 days.

(21) Appl. No.: 10/603,720

(22) Filed: Jun. 26, 2003

(65) Prior Publication Data
US 2004/0135096 A1 Jul. 15, 2004

(30) Foreign Application Priority Data
Jan. 15, 2003 (JP) ........................................ 2003-006505

(51) Int. Cl.⁷ ................................................ H01J 37/20
(52) U.S. Cl. ............... 250/442.11; 250/307; 250/492.21
(58) Field of Search ............................ 250/442.11, 307, 250/492.21

(56) References Cited

U.S. PATENT DOCUMENTS 6,538,254 B1 * 3/2003 Tomimatsu et al. ..... 250/442.11
6,717,156 B2 * 4/2004 Sugaya et al. ......... 250/440.11

* cited by examiner

*Primary Examiner*—Kiet T. Nguyen
(74) *Attorney, Agent, or Firm*—Antonelli, Terry, Stout & Kraus, LLP (57) ABSTRACT

A microfabrication apparatus and a microfabrication method that, using a mechanical probe formed at its tip with a microscopic rod in sample preparation, can improve the life of the probe to 10 to 300 times from conventional 3 to 5 times in terms of the number of sample preparation enabling times.

9 Claims, 11 Drawing Sheets

DIAMETER OF THE FORMER PROBE (um)

LENGTH OF THE MICROSCOPIC ROD (μm)

LENGTH OF THE MICROSCOPIC ROD (μm)

MICROFABRICATION APPARATUS AND MICROFABRICATION METHOD

CROSS REFERENCE TO RELATED APPLICATION

The present application relates to a U.S. Ser. No. 10/619,445 being filed based on Japanese Patent Application No. 2003-001665 filed Jan. 8, 2003, the contents of which are incorporated herein by reference.

BACKGROUND OF THE INVENTION

The present invention relates to a charged particle beam apparatus that irradiates a charged particle beam onto a sample so as to observe, analyze and process the sample and, in particular, relates to a microfabrication apparatus that implements sample preparation using a mechanical probe, and a probe control method.

Charged particle beam apparatuses for irradiating a charged particle beam onto a sample so as to observe, analyze and process the sample have been widely used in the fields of science and engineering. In recent years, it has been generally carried out to introduce a mechanical probe (hereinafter also referred to as "probe") into a charged particle beam apparatus, thereby to perform measurement of electrical characteristics of samples, sample preparation, and so on. For example, by combining the focused ion beam technology and the micromanipulation technology, samples in the order of several microns to submicrons can be prepared. This technique is disclosed in JP-A-5-52721 (known example 1).

Figure 1A:
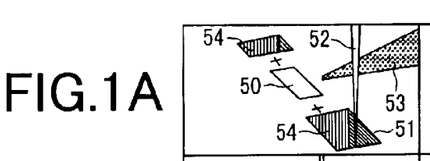
FIGS. 1A to 1J are diagrams showing a sample preparation method according to known example 1.
Figure 1B:
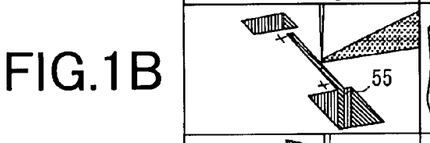

In the known example 1, a posture of a sample substrate 51 is retained such that an ion beam 52 is irradiated perpendicularly onto the surface of the substrate 51, then the ion beam 52 scans rectangularly in the neighborhood of an observation area 50 to form rectangular holes 54 having a given depth on the surface of the substrate 51 (FIG. 1A). Then, the ion beam 52 scans rectangularly to form a trench 55 on the surface of the substrate 51 (FIG. 1B).

Figure 1C:
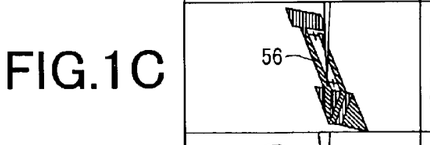
Figure 1D:
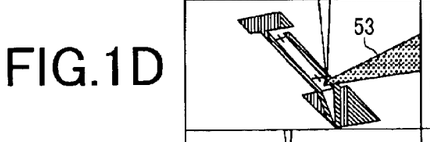
Figure 1E:
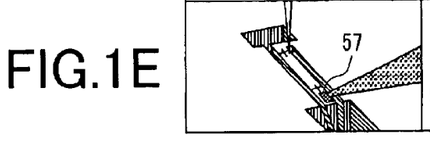
Figure 1F:
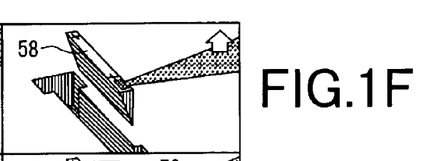
Figure 1G:
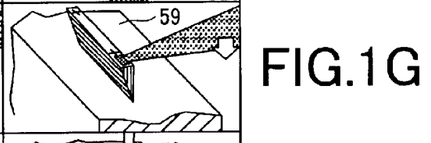
Figure 1H:
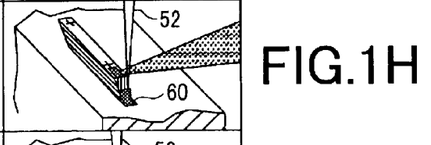
Figure 1I:
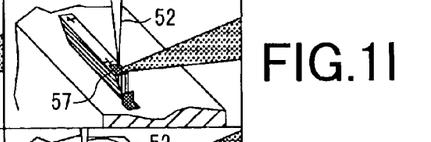
Figure 1J:
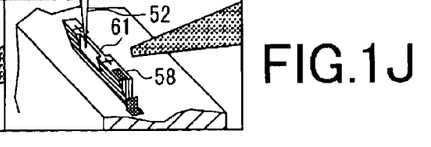

Then, the substrate 51 is inclined such that the axis of the ion beam 52 is inclined by about 30° relative to the surface of the substrate 51, thereby to form an inclined trench 56. The posture change in inclination of the substrate 51 is implemented by a specimen stage (FIG. 1C). The tip of a mechanical probe 53 is brought into contact with a portion of the substrate 51 that becomes a sample (FIG. 1D). Adsorbed gas is supplied from a nozzle for adsorbed gas 20, and the ion beam 52 is irradiated locally onto an area including the tip of the mechanical probe 53, thereby to form an ion beam assisted deposition (hereinafter referred to as "IBAD") film 57. The tip of the mechanical probe 53 and a sample piece 58 being a separated portion of the substrate 51 in the contacting state are connected to each other by the IBAD film 57 (FIG. 1E). Notching is applied to a residual portion by means of an focused ion beam to cut out the separated sample piece 58 from the substrate 51. The cut-out separated sample piece 58 comes into the state of being supported by the connected mechanical probe 53 (FIG. 1F). The separated sample piece 58 is moved to a required portion, i.e. a sample carrier 59 in this example (FIG. 1G). An IBAD film 60 is formed in an area including the separated sample piece 58 and the sample carrier 59 (FIG. 1H). The observation area 50 in the separated sample piece 58 is formed into a membrane 61 having a thickness of about 100 nm, using an ion beam 52 (FIG. 1I). An electron beam is transmitted through the membrane 61 to carry out observation in transmission electron microscopy.

In this example, no specific explanation is given about a method of restoring or replacing the probe, which is required due to fatigue of the probe caused by extraction of a plurality of separated samples. In practice, by restoring the probe through probe processing using a focused ion beam, or replacing the probe, a plurality of separated samples are extracted using a sample preparing apparatus that combines the focused ion beam technology and the micromanipulation technology.

In the foregoing apparatus that prepares samples by combining the focused ion beam technology and the micromanipulation technology, a probe is fatigued every time probe operations of bonding, cutting off, and fixing a sample are repeated, so that an operator should repeat processing or replacement of a probe per sample preparation. In the conventional apparatus, the operator processes a probe or replaces a probe by taking it out from a sample chamber, relying on an observation image produced by a charged particle beam apparatus. The probe processing is work that requires skill because it is necessary to operate both a probe controller and the charged particle beam apparatus. In such a conventional apparatus, there have been problems to be solved as follows. Specifically, an operator replaces a probe by detaching it from a holder and attaching a new one to the holder using a pincette or the like, while confirming based on eye measurement. Thereupon, if the operator fails in probe replacement, the tip of the probe may be damaged. Further, the number of times that a probe can be restored through the focused ion beam processing without replacement is three to five at most. Therefore, for extracting many samples, the probe replacement should be carried out frequently.

SUMMARY OF THE INVENTION

Therefore, it is an object of the present invention to improve throughput of sample preparation by eliminating operations of probe restoration and probe replacement.

As means for accomplishing the foregoing object, the following are cited.

(1) There is provided a microfabrication apparatus comprising a charged particle gun; a lens for condensing a charged particle beam emitted from the charged particle gun; a deflector; a detector for detecting a secondary particle from a sample upon irradiation of the charged particle beam onto the sample; a specimen stage for retaining thereon the sample; a specimen-stage position controller for controlling a position of the specimen stage; a mechanical probe to be connected with a microscopic rod at its tip; and the microscopic rod wherein a mean area of sections at arbitrary three points of a central portion thereof excluding its tip and root is set to 1 $nm^2$ to 100 $\mu m^2$, and a length of the central portion is set to 20 to 300 times the shortest diameter of the sections. With this arrangement, the synthetically efficient microfabrication apparatus that excludes a probe restoration operation upon preparing a plurality of samples, simultaneously prolongs the life of the probe to reduce a probe replacing operation, and simultaneously excludes influence of vibration, charge, etc. to the probe during a sample preparation operation, can be provided.

(2) There is provided a microfabrication apparatus comprising a charged particle gun; a lens for condensing a charged particle beam emitted from the charged particle gun; a deflector; a detector for detecting a secondary particle from a sample upon irradiation of the charged particle beam onto the sample; a specimen stage for retaining thereon the sample; a specimen-stage position controller for controlling a position of the specimen stage; a mechanical probe having a microscopic rod at its tip; and the microscopic rod wherein a mean value of thicknesses at arbitrary three points of a central portion of the microscopic rod excluding its tip and root is set to 1 to 10 μm, and the length of the central portion is set to 50 to 300 μm. With this arrangement, the synthetically efficient microfabrication apparatus that excludes a probe restoration operation upon preparing a plurality of samples, simultaneously prolongs the life of the probe to reduce a probe replacing operation, and simultaneously excludes influence of vibration, charge, etc. to the probe during a sample preparation operation, can be provided.

(3) There is provided a microfabrication apparatus comprising a charged particle gun; a lens for condensing a charged particle beam emitted from the charged particle gun; a deflector; a detector for detecting a secondary particle from a sample upon irradiation of the charged particle beam onto the sample; a specimen stage for retaining thereon the sample; a specimen-stage position controller for controlling a position of the specimen stage; a mechanical probe having a microscopic rod at its tip; and the microscopic rod wherein a mean value of thicknesses at arbitrary three points of a central portion of the microscopic rod excluding its tip and root is set to 1 nm to 10 μm, and the length of the central portion is set to 20 to 300 times the thickness mean value. With this arrangement, the synthetically efficient microfabrication apparatus that excludes a probe restoration operation upon preparing a plurality of samples, simultaneously prolongs the life of the probe to reduce a probe replacing operation, and simultaneously excludes influence of vibration, charge, etc. to the probe during a sample preparation operation, can be provided.

(4) In each of the foregoing microfabrication apparatuses, a material of the microscopic rod includes at least one selected from the group consisting of tungsten, molybdenum, beryllium, nickel, tantalum, palladium, and osmium. With this arrangement, the microscopic rod wherein the mean value of thicknesses at arbitrary three points of the central portion of the microscopic rod excluding its tip and root is set to 1 μm, and the length of the central portion is set to 300 μm, can retain the strength to bear the sample preparation.

(5) There is provided a microfabrication method for use with a charged particle gun, a lens for condensing a charged particle beam emitted from the charged particle gun, a deflector, a detector for detecting a secondary particle from a sample upon irradiation of the charged particle beam onto the sample, a specimen stage for retaining thereon the sample, a specimen-stage position controller for controlling a position of the specimen stage, and a mechanical probe having a microscopic rod at its tip, the microfabrication method comprising the steps of:

(a) contacting the tip of the microscopic rod and a first sample to each other;
(b) fixing together the tip of the microscopic rod and the first sample;
(c) moving the first sample along with the microscopic rod;
(d) cutting the microscopic rod at a root-side portion thereof near a fixing portion so as to separate the microscopic rod and the first sample from each other;
(e) contacting the tip of the microscopic rod after cutting with a second sample;
(f) fixing together the tip of the microscopic rod and the second sample;
(g) moving the second sample along with the microscopic rod;
(h) cutting the microscopic rod at a root-side portion thereof near a fixing portion so as to separate the microscopic rod and the second sample from each other; and
(i) repeating the steps (e) to (h), whereby at least 10 or more samples are extracted. With this arrangement, the synthetically efficient microfabrication method that can efficiently extract a plurality of samples, and simultaneously prolong the life of the probe to reduce a probe replacing operation, can be provided.

(6) In the foregoing microfabrication method of (5), at least 25 samples are extracted. With this arrangement, the synthetically efficient microfabrication method that excludes a probe restoration operation upon preparing a plurality of samples, and simultaneously prolongs the life of the probe to reduce a probe replacing operation, can be provided.

(7) In the foregoing microfabrication method of (5), at least 50 samples are extracted. With this arrangement, the synthetically efficient microfabrication method that excludes a probe restoration operation upon preparing a plurality of samples, and simultaneously prolongs the life of the probe to reduce a probe replacing operation, can be provided.

(8) In each of the foregoing microfabrication methods of (5), (6) and (7), a mean area of sections at arbitrary three points of a central portion of the microscopic rod excluding its tip and root is set to 1 $nm^2$ to 100 $\mu m^2$, and a length of the central portion is set to 20 to 300 times the shortest diameter of the sections. With this arrangement, the synthetically efficient microfabrication method that excludes a probe restoration operation upon preparing a plurality of samples, prolongs the life of the probe to reduce a probe replacing operation, and simultaneously excludes influence of vibration, charge, etc. to the probe during a sample preparation operation, can be provided.

(9) In each of the foregoing microfabrication methods of (5), (6) and (7), a mean value of thicknesses at arbitrary three points of a central portion of the microscopic rod excluding its tip and root is set to 1 to 10 μm, and the length of the central portion is set to 50 to 300 μm. With this arrangement, the synthetically efficient microfabrication method that excludes a probe restoration operation upon preparing a plurality of samples, prolongs the life of the probe to reduce a probe replacing operation, and simultaneously excludes influence of vibration, charge, etc. to the probe during a sample preparation operation, can be provided.

(10) In each of the foregoing microfabrication methods of (5), (6) and (7), a mean value of thicknesses at arbitrary three points of a central portion of the microscopic rod excluding its tip and root is set to 1 nm to 10 μm, and the length of the central portion is set to 20 to 300 times the thickness mean value. With this arrangement, the synthetically efficient microfabrication method that excludes a probe restoration operation upon preparing a plurality of samples, prolongs the life of the probe to reduce a probe replacing operation, and simultaneously excludes influence of vibration, charge, etc. to the probe during a sample preparation operation, can be provided.

The present invention synthetically improves throughput of sample preparation by using a mechanical probe formed at its tip with a microscopic rod in sample preparation performed by a charged particle beam apparatus, so as to eliminate a probe restoration operation upon sample extraction and prolong the life of the probe to reduce probe replacement to 1 to 30 times for preparation of 300 samples.

Other objects, features and advantages of the invention will become apparent from the following description of the embodiments of the invention taken in conjunction with the accompanying drawings.

BRIEF DESCRIPTION OF THE DRAWINGS

FIGS. 2A and 2B are diagrams respectively showing probes, wherein FIG. 2A shows the conventional probe, while

FIGS. 6A and 6B are diagrams each showing a method of fixing a separated sample piece to the probe, wherein FIG. 6A shows a case where the conventional probe is used, while

FIGS. 7A and 7B are diagrams each showing a method of restoring the probe, wherein FIG. 7A shows a case where the conventional probe is used, while

DESCRIPTION OF THE EMBODIMENTS
<Embodiment 1>

Figure 2A:
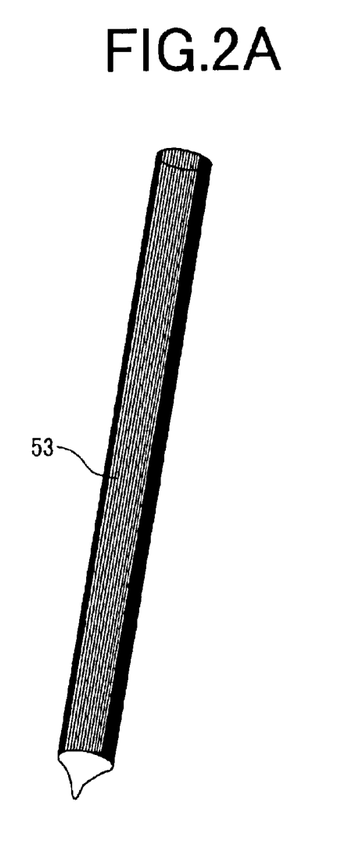
Figure 2B:
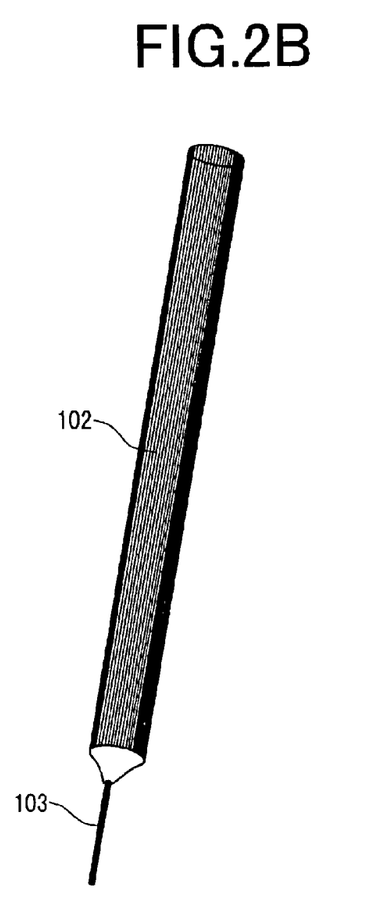
FIG. 2B shows the probe formed at its tip with a microscopic rod being one example of an embodiment of the present invention.

FIGS. 2A and 2B show probes, respectively, wherein FIG. 2A shows the conventional probe, while FIG. 2B shows the probe of this embodiment that is formed at its tip with a microscopic rod being one example of the embodiment of the present invention. The conventional probe 53 is in the form of a tungsten line that is formed with a sharp tip by electropolishing. The probe of this embodiment comprises a tungsten line 102 having a microscopic rod 103 at its tip. The microscopic rod 103 has a thickness of 2 $\mu$m and a length of 40 $\mu$m. On the other hand, the tungsten line 102 has a thickness of 50 $\mu$m.

Figure 3:
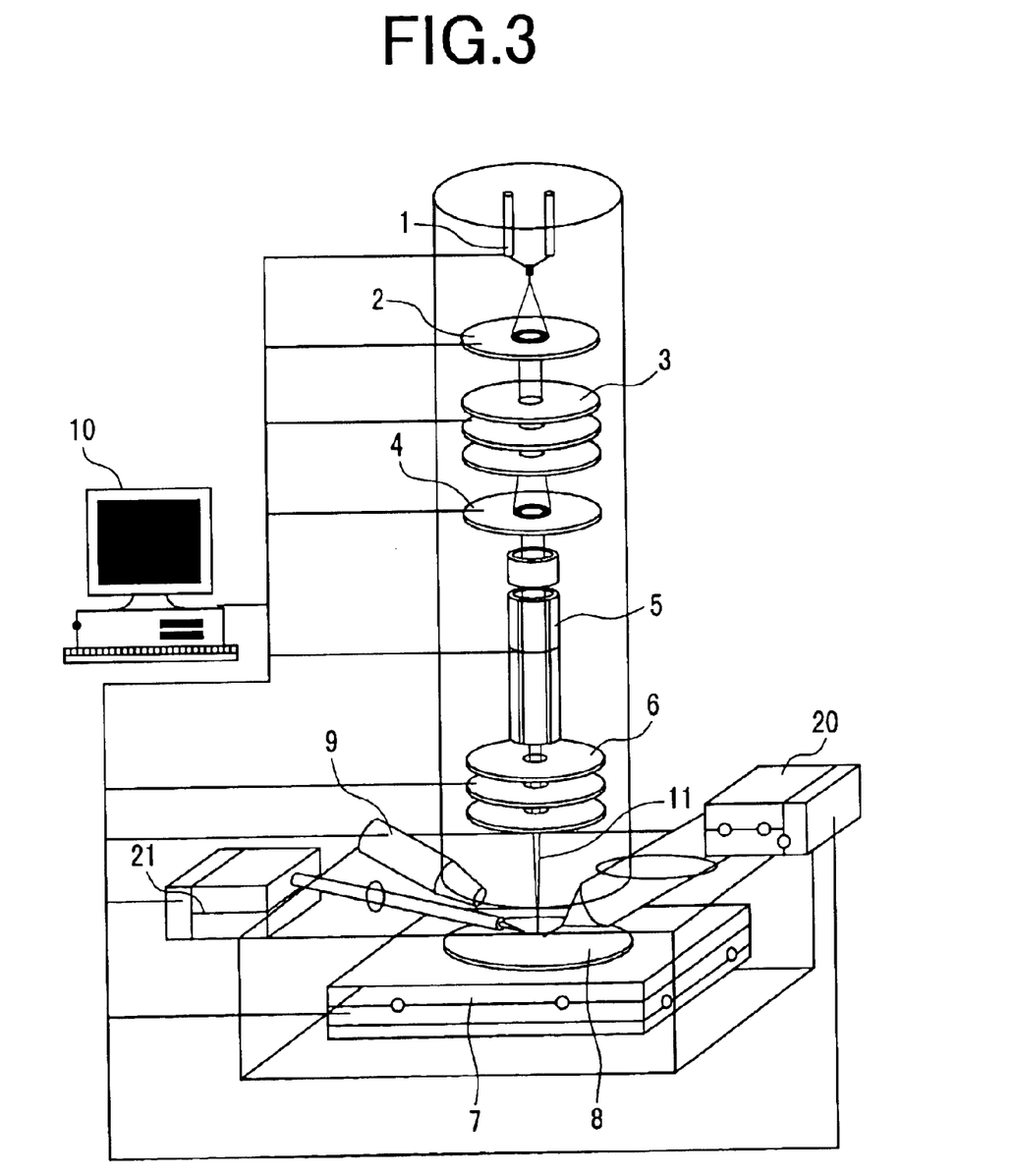
FIG. 3 is a diagram showing a basic structure of a microfabrication apparatus being one example of an embodiment of the present invention.

FIG. 3 shows a basic structure of a microfabrication apparatus being one example of the embodiment of the present invention. The microfabrication apparatus comprises a charged particle beam apparatus wherein an ion beam is extracted from an ion source 1 by an extractor 2 and, after condensing the ion beam by a condenser lens 3, the ion beam is throttled by a beam limiting aperture 4 and then focused onto the surface of a sample 8 by an objective lens 6, and further comprises a movable specimen stage 7 for placing thereon a sample, a secondary-particle detector 9, a deflector 5, a controller 10, a nozzle for adsorbed gas 20, and a mechanical probe 21.

Figure 4:
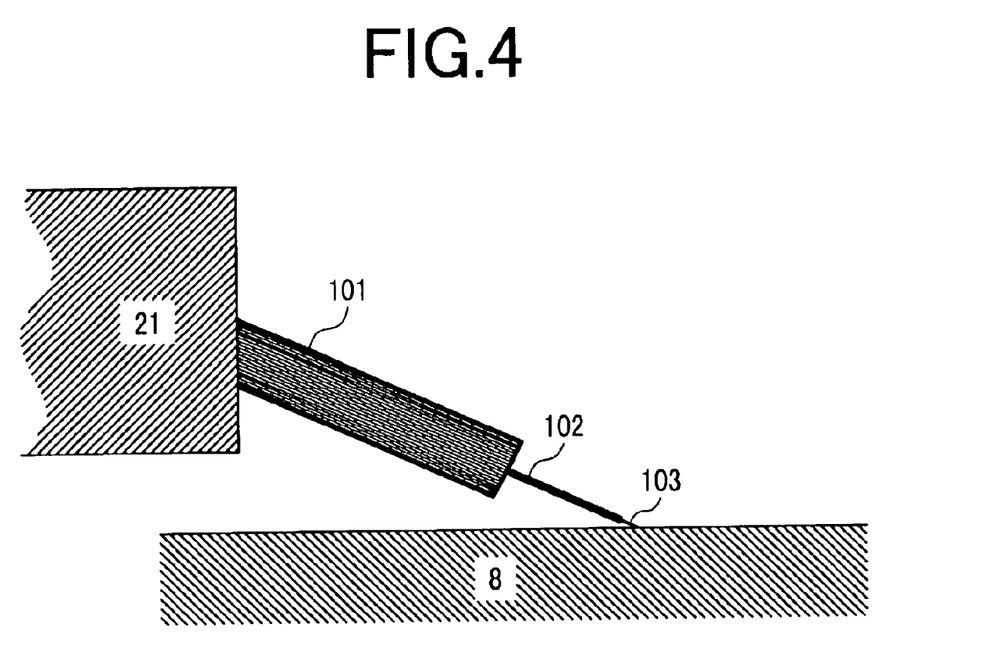
FIG. 4 is a diagram showing a method of fixing a microscopic rod to a mechanical probe.

FIG. 4 shows a method of fixing the microscopic rod 103 to the mechanical probe 21. A plug 101 is fixed to the mechanical probe 21, the tungsten line 102 is fixed to the tip of the plug 101, and the tungsten line 102 has the microscopic rod 103 at its tip. The tungsten line 102 is fixed to the mechanical probe 21 so as to be inclined relative to the surface of the sample 8. With this arrangement, the tip of the microscopic rod 103 can contact with the surface of the sample with no interference of the mechanical probe 21, the plug 101 and the tungsten line 102.

FIGS. 5A to 5J show a microfabrication method in this embodiment, which will be described hereinbelow along the flow.

Figure 5A:
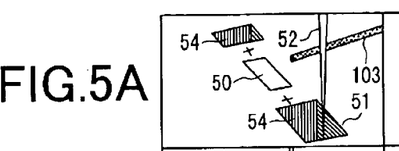
FIGS. 5A to 5J are diagrams showing a microfabrication method being one example of an embodiment of the present invention.
Figure 5B:
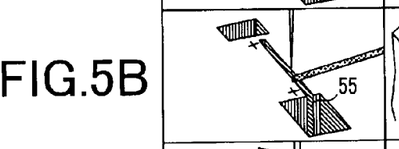

In this embodiment, a posture of a sample substrate 51 is retained such that an ion beam 52 is irradiated perpendicularly onto the surface of the substrate 51, then the ion beam 52 scans rectangularly in the neighborhood of an observation area 50 to form rectangular holes 54 having a given depth on the surface of the substrate 51 (FIG. 5A). Then, the ion beam 52 scans rectangularly to form a trench 55 on the surface of the substrate 51 (FIG. 5B).

Figure 5C:
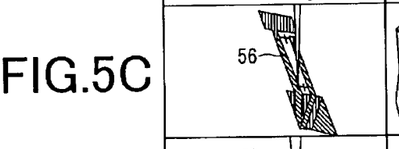
Figure 5D:
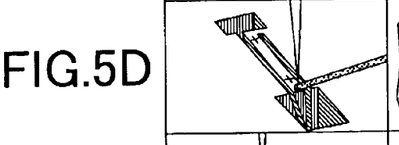
Figure 5E:
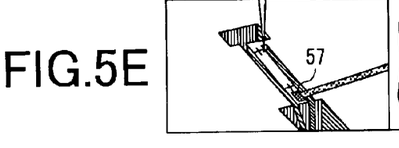
Figure 5F:
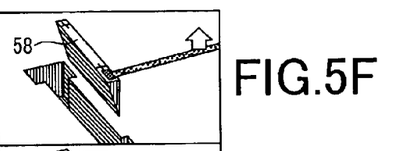
Figure 5G:
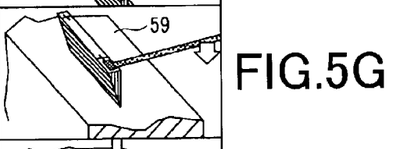
Figure 5H:
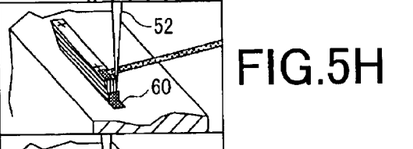
Figure 5I:
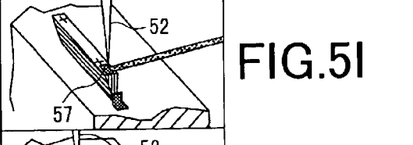
Figure 5J:
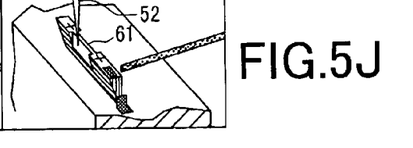

Then, the substrate 51 is inclined such that the axis of the ion beam 52 is inclined by about 30° relative to the surface of the substrate 51, thereby to form an inclined trench 56. The posture change in inclination of the substrate 51 is implemented by the specimen stage (FIG. 5C). The tip of the microscopic rod 103 is brought into contact with a portion of the substrate 51 that becomes a sample (FIG. 5D). Adsorbed gas is supplied from the nozzle for adsorbed gas 20, and the ion beam 52 is irradiated locally onto an area including the tip of the microscopic rod 103, thereby to form an IBAD film 57. The tip of the microscopic rod 103 and a sample piece 58 being a separated portion of the substrate 51 in the contacting state are connected to each other by the IBAD film 57 (FIG. 5E). Notching is applied to a residual portion by means of an focused ion beam to cut out the separated sample piece 58 from the substrate 51. The cut-out separated sample piece 58 comes into the state of being supported by the connected microscopic rod 103 (FIG. 5F). The separated sample piece 58 is moved to a required portion, i.e. a sample carrier 59 in this embodiment (FIG. 5G). An IBAD film 60 is formed in an area including the separated sample piece 58 and the sample carrier 59 (FIG. 5H). The microscopic rod 103 is cut at a portion distanced about 2 $\mu$m from the tip thereof so as to separate the microscopic rod 103 and the separated sample piece 58 from each other (FIG. 5I). Further, the observation area 50 in the separated sample piece 58 is formed into a membrane 61 having a thickness of about 100 nm, using an ion beam 52. An electron beam is transmitted through the membrane 61 to carry out observation in transmission electron microscopy. Again, a separated sample piece 58 is prepared through the steps of FIGS. 5A to 5C, and the tip of the microscopic rod 103 separated in the previous step of FIG. 5I is brought into contact with a portion of the substrate 51 that becomes a sample (FIG. 5D). Further, the separated sample piece 58 is conveyed to the sample carrier 59 through the steps of FIGS.

5E to 5I. By repeating the steps of FIGS. 5A to 5I, as many as ten separated sample pieces 58 can be conveyed to the sample carrier 59 without processing or replacing the microscopic rod 103.

<Embodiment 2>

Using the microfabrication apparatus being one example of the embodiment of the present invention as shown in FIG. 3, evaluation/analysis of semiconductor wafers was conducted. In general, about wafers are produced in a lump in the semiconductor manufacturing process. The microscopic rod 103 shown in FIG. 2B was changed to have a diameter of 2 $\mu$m and a length of 50 $\mu$m. Using this microscopic rod 103, one separated sample piece 58 was extracted from each of the 25 wafers. By analyzing those separated sample pieces 58, comparison among the 25 wafers was able to be achieved. Since it was possible to extract those 25 separated sample pieces 58 without processing or replacing the microscopic rod 103, the throughput of sample preparation was improved.

<Embodiment 3>

Like in Embodiment 2, using the microfabrication apparatus being one example of the embodiment of the present invention as shown in FIG. 3, evaluation/analysis of semiconductor wafers was conducted. The microscopic rod 103 shown in FIG. 2B was changed to have a diameter of 2 $\mu$m and a length of 100 $\mu$m. Using this microscopic rod 103, separated sample pieces 58 were extracted from two different portions of each of the 25 wafers. By analyzing the two separated sample pieces 58 extracted from each wafer, evaluation of uniformity within each wafer was able to be compared among the 25 wafers. Since it was possible to extract those 50 separated sample pieces 58 without processing or replacing the microscopic rod 103, the throughput of sample preparation was improved.

<Embodiment 4>

Figure 6A:
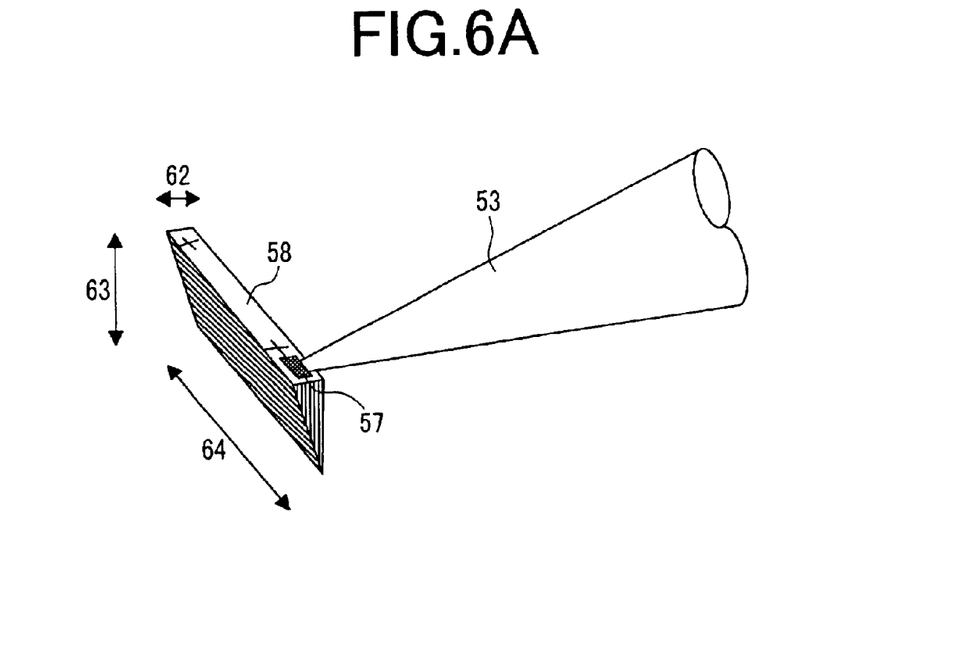
Figure 6B:
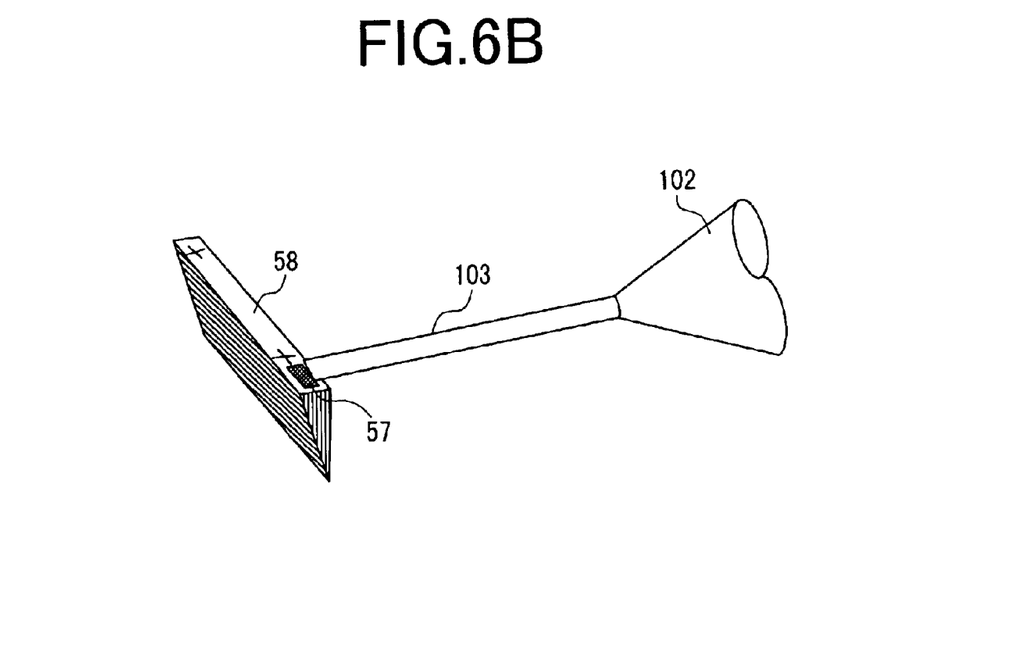
FIG. 6B shows a case where the probe formed at its tip with the microscopic rod is used.

FIGS. 6A and 6B each show a method of fixing the separated sample piece 58 to the probe, wherein FIG. 6A shows a case where the conventional probe is used, while FIG. 6B shows a case where the probe formed at its tip with the microscopic rod 103 being one example of the embodiment of the present invention is used. As general dimensions of the separated sample piece 58, a thickness 62 is about 4 $\mu$m, a height 63 is about 20 $\mu$m, and a width 64 is about 30 $\mu$m. The conventional probe 53 fixes, at its sharp tip, the separated sample piece 58 with the IBAD film 57. When a sectional area of the microscopic rod 103 is set to 20 $\mu m^2$ or less, for example, in case of the microscopic rod 103 having a rectangular section of 4 $\mu$m×5 $\mu$m, it is possible to fix the separated sample piece 58 using the IBAD film 57 almost satisfactorily. However, when the sectional area thereof exceeds 20 $\mu m^2$, for example, in case of the microscopic rod 103 having a rectangular section of 5 $\mu$m×5 $\mu$m, the width of the microscopic rod 103 is greater than the thickness of the separated sample piece 58 so that fixation of the separated sample piece 58 by the IBAD film 57 becomes difficult. Further, in case of the microscopic rod 103 having a rectangular section of 3 $\mu$m×7 $\mu$m, although the width of the microscopic rod 103 is smaller than the thickness of the separated sample piece 58, inasmuch as the height from the contacting bottom surface is as high as 7 $\mu$m, fixation of the separated sample piece 58 by the IBAD film 57 becomes difficult. Therefore, for fixing the separated sample piece 58 having the general size to the microscopic rod, the sectional area thereof is preferably set to 20 $\mu m^2$ or less.

Figure 7A:
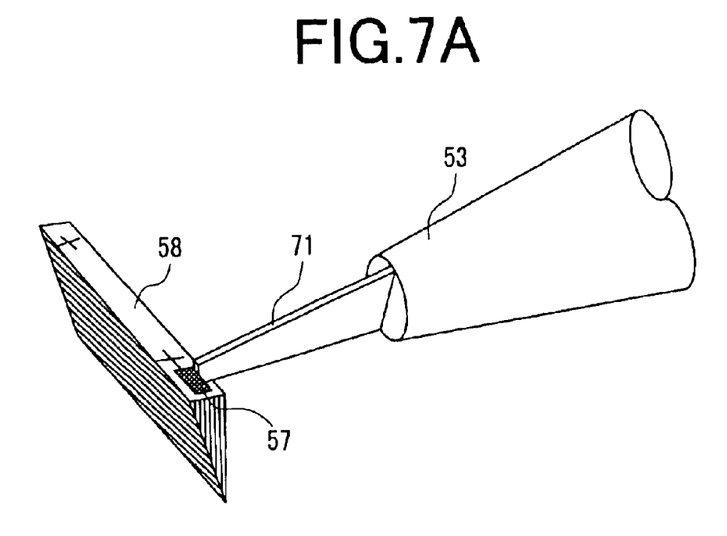
Figure 7B:
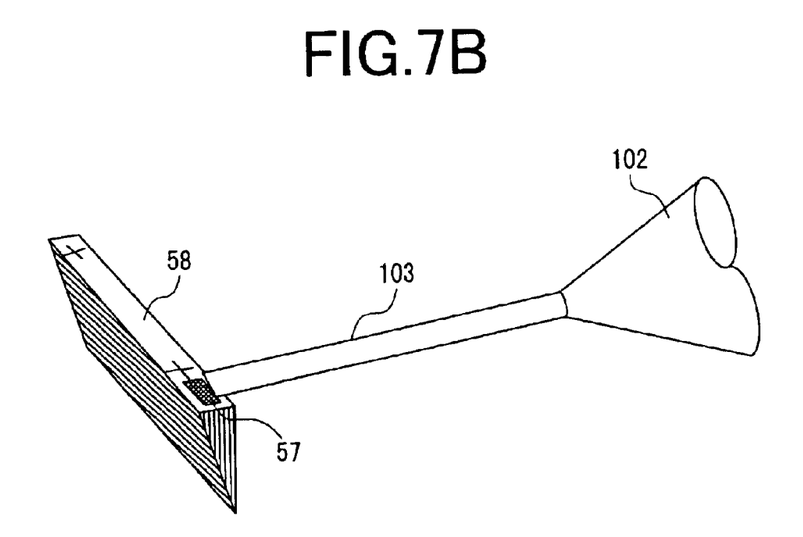
FIG. 7B shows a case where the probe formed at its tip with the microscopic rod is used.

FIGS. 7A and 7B each show a method of restoring the probe, wherein FIG. 7A shows a case where the conventional probe is used, while FIG. 7B shows a case where the probe formed at its tip with the microscopic rod 103 being one example of the embodiment of the present invention is used. In case of the conventional probe 53, since the sharp tip thereof is lost due to repetition of conveying the separated sample piece 58, the probe 53 is replaced with a new one, or a restored portion 71 processed by the ion beam 52 is fixed to the separated sample piece 58 by the IBAD film 57. However, the probe having at its tip the microscopic rod 103 of the present invention is only shortened by a length about twice its diameter upon every sample extraction and thus can repeat conveyance of the separated sample piece 58. Therefore, it can repeat conveyance of the separated sample piece 58 about 50 times until the microscopic rod 103 is lost. If a joining portion between the tungsten line 102 and the microscopic rod 103 has a smooth conical shape, even the tip of the microscopic rod 103 that has been extremely shortened due to conveyance of the separated sample piece 58 can contact with the sample 8, so that the probe can be used for conveyance of the separated sample piece 58 until the microscopic rod 103 is shortened to the root thereof.

<Embodiment 5>

Figure 8:
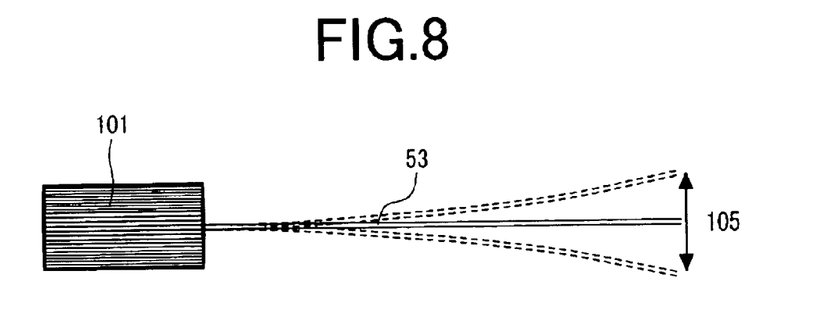
FIG. 8 is a diagram showing the state of resonance vibration of the conventional probe.

FIG. 8 shows the state of resonance vibration 105 of the conventional probe 53.

Figure 9:
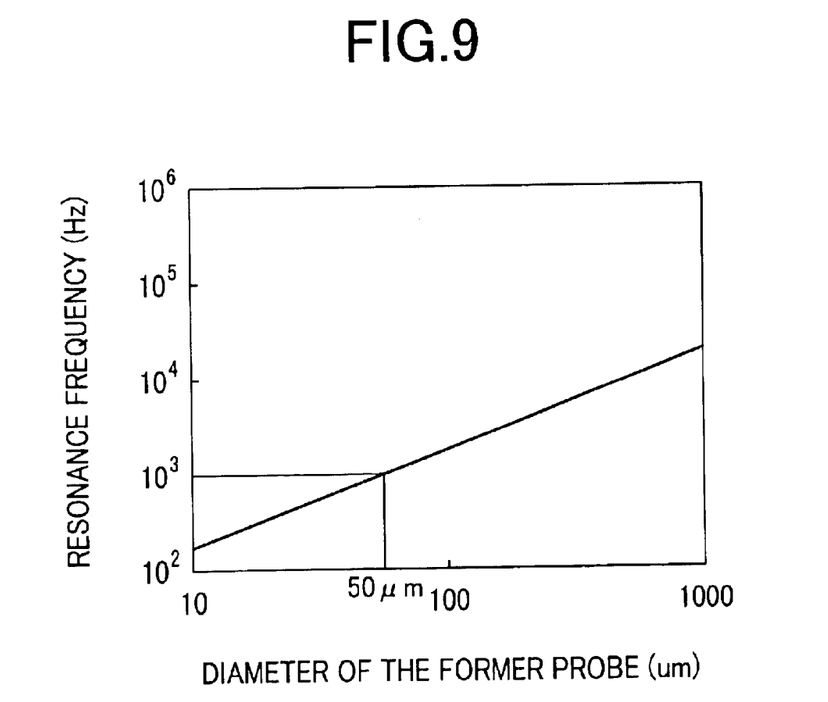
FIG. 9 is a diagram showing dependency of a resonance frequency upon a diameter of the conventional probe.

Taking interference of a plug 101 into consideration, the probe 53 shown in Embodiment 1 has a length of about 3 mm for allowing the tip thereof to contact with the sample 8. The probe 53 fixed to the tip of the plug 101 largely vibrates at a frequency resonant with vibration of the plug 101 (hereinafter this frequency will be referred to as "resonance frequency"). FIG. 9 shows dependency of the resonance frequency upon the diameter of the probe 53. When the resonance frequency is small, the probe 53 easily vibrates due to influence of disturbance and thus can not be used. The diameter of the probe 53 put to practical use is 50 to 150 $\mu$m in terms of restriction of preparation and strength. Therefore, the resonance frequency of the conventional probe 53 is 1 kHz or higher.

Figure 10:
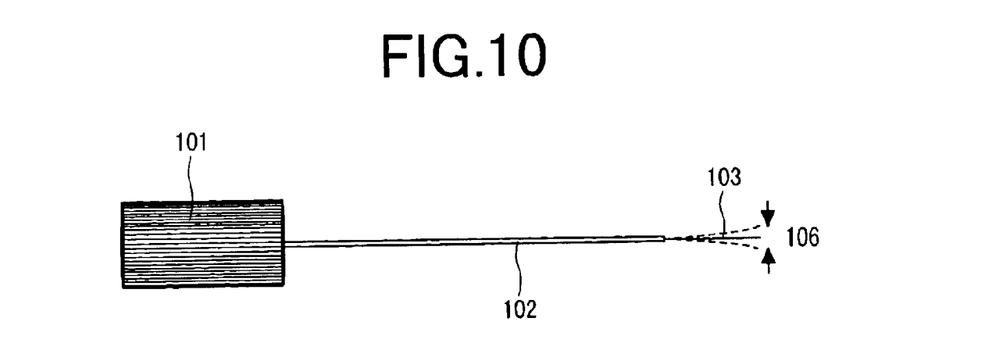
FIG. 10 is a diagram showing the state of resonance vibration of the probe formed at its tip with the microscopic rod.
Figure 11:
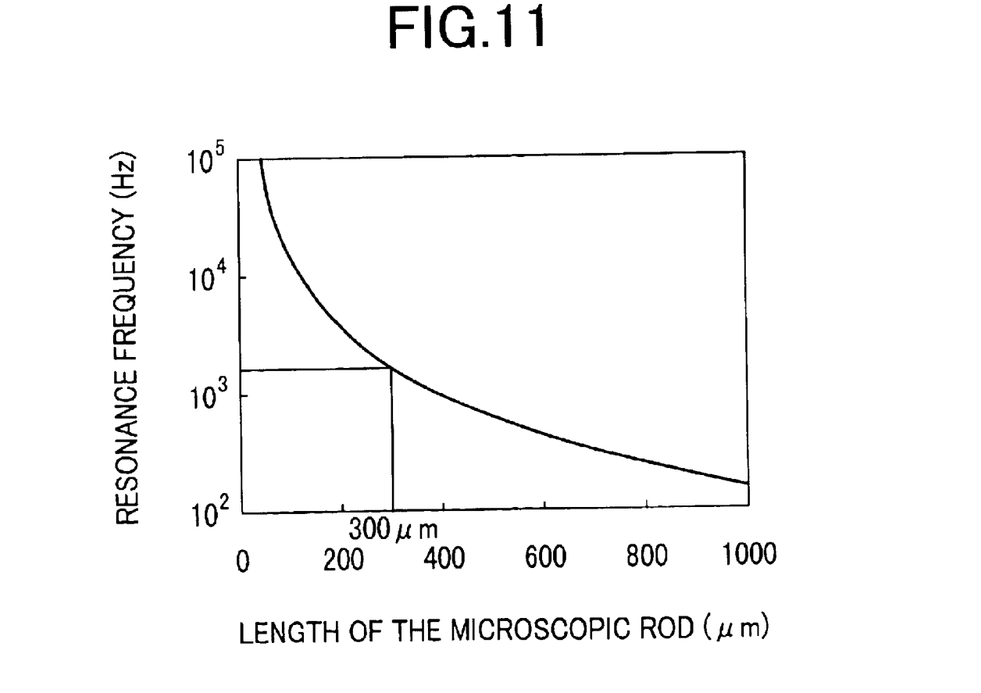
FIG. 11 is a diagram showing dependency of a resonance frequency upon a length of the microscopic rod.

FIG. 10 shows the state of resonance vibration 106 of the probe formed at its tip with the microscopic rod 103 being one example of the embodiment of the present invention. The microscopic rod 103 formed at the tip of the tungsten line 102 fixed to the plug 101 largely vibrates at a resonance frequency due to vibration of the plug 101. FIG. 11 shows dependency of the resonance frequency upon the length of the microscopic rod 103. The diameter of the microscopic rod 103 in this embodiment is 1 $\mu$m. As the length of the microscopic rod 103 decreases, the resonance frequency increases. For increasing the resonance frequency to 1 kHz or higher, it is necessary that the length of the microscopic rod 103 is about 300 $\mu$m or less. Therefore, for obtaining the resonance frequency equal to or greater than that of the conventional probe 53, it is necessary that the length of the microscopic rod 103 is set to 300 times its diameter or less in case of the diameter being 1 $\mu$m. It is necessary that the length of the microscopic rod 103 is set to about 500 $\mu$m or less when the diameter is 2 $\mu$m, about 600 am or less when 3 $\mu$m, and about 700 $\mu$m or less when 4 82 m.

<Embodiment 6>

Figure 12:
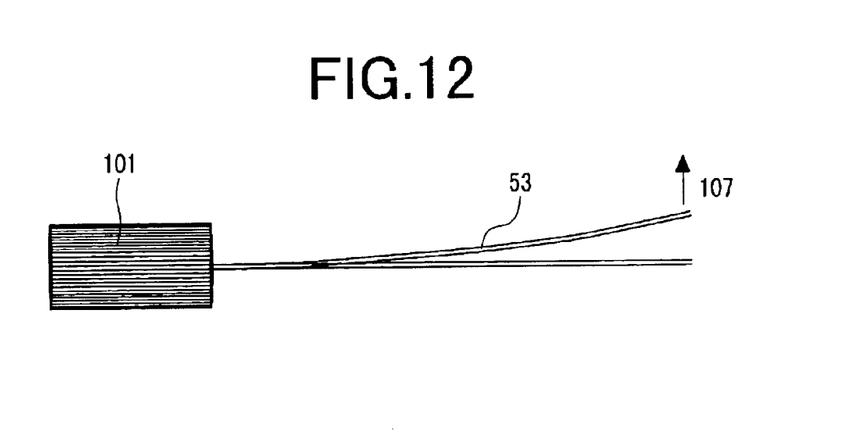
FIG. 12 is a diagram showing the state of bending stress of the conventional probe.
Figure 13:
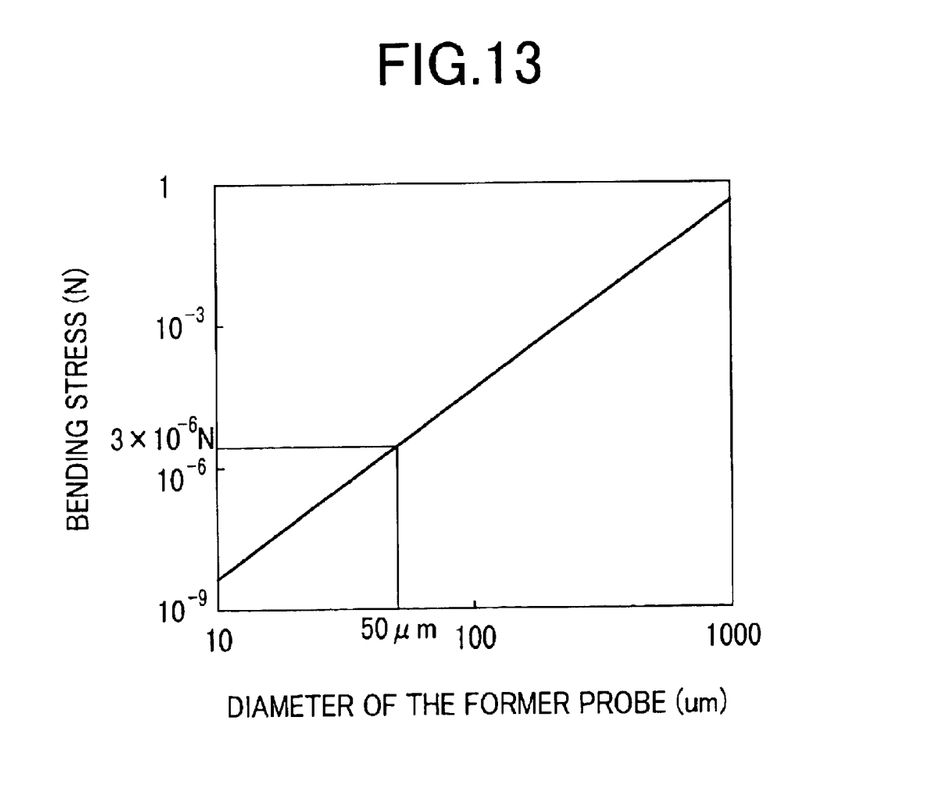
FIG. 13 is a diagram showing dependency of a bending stress upon a diameter of the conventional probe relative to lateral bending of 1 $\mu$m.

FIG. 12 shows the state of bending stress of the conventional probe 53. As shown in Embodiment 1, the length of the probe 53 is about 3 mm. When a force 107 is applied to the tip of the probe 53 fixed to the tip of the plug 101, the probe 53 is bent. The force 107 balances with a bending stress of the probe 53. FIG. 13 shows dependency of the bending stress upon the diameter of the probe 53 when the tip of the probe 53 is bent laterally by 1 $\mu$m. Since the diameter of the probe 53 put to practical use is set to 50 to 150 μm in terms of restriction of preparation and strength, the bending stress of the probe 53 is $10^{-6}$ N or greater. As the force 107 applied to the probe 53 upon sample preparation, there are two kinds, i.e. weight of the separated sample piece 58, and a force of electric field due to charge generated in an insulator sample and so on. The weight of the separated sample piece 58 is $10^{-8}$ g or less, while the force 107 applied to the probe 53 is $10^{-10}$ N or less. Therefore, there is no influence of the weight of the separated sample piece 58 to the probe 53. The bending stress $10^{-6}$ N of the probe 53 is given as a safety strength for preventing bending caused by the force of electric field due to charge etc. during sample preparation. On the other hand, in case of the probe 53 having a diameter of 20 μm or less with a bending stress of $10^{-8}$ N or greater, there was a case where extraction of a sample was not achieved due to occurrence of vibration etc. due to charge during sample preparation.

Figure 14:
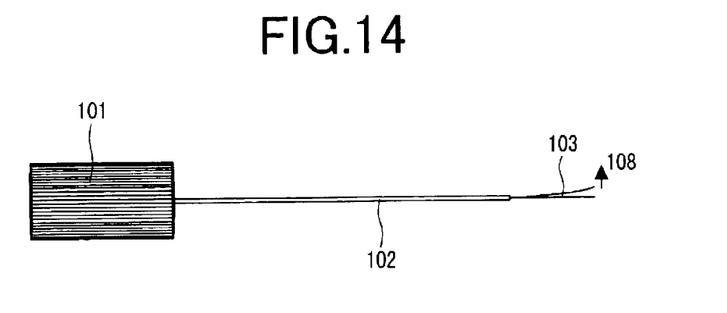
FIG. 14 is a diagram showing the state of bending stress of the probe formed at its tip with the microscopic rod.
Figure 15:
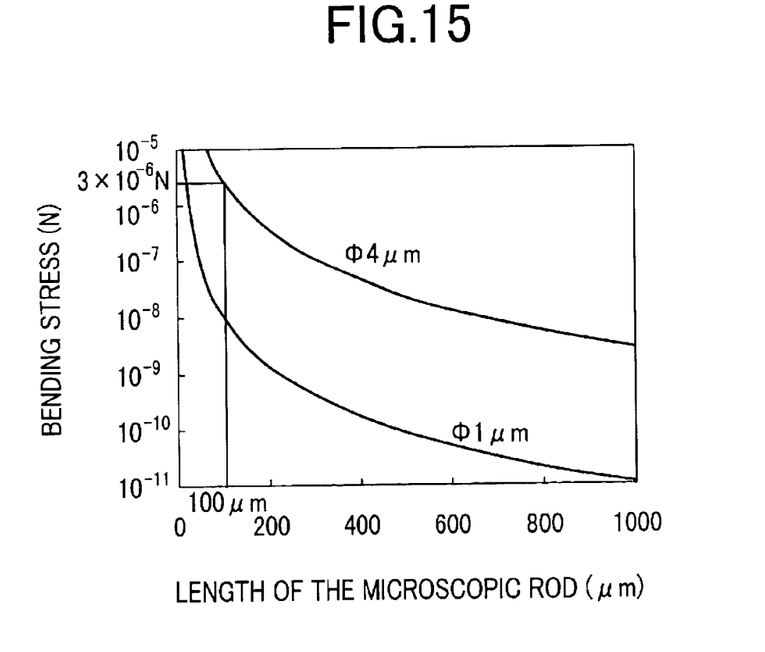
FIG. 15 is a diagram showing dependency of a bending stress upon a length of the microscopic rod relative to lateral bending of 1 $\mu$m.

FIG. 14 shows the state of bending stress of the probe formed at its tip with the microscopic rod 103 being one example of the embodiment of the present invention. When a force 108 is applied to the tip of the microscopic rod 103 formed at the tip of the tungsten line 102 fixed to the plug 101, the microscopic rod 103 is bent. The force 108 balances with a bending stress of the microscopic rod 103. FIG. 15 shows dependency of the bending stress upon the length of the microscopic rod 103 when the tip of the microscopic rod 103 is bent laterally by 1 μm. For increasing the bending stress of the microscopic rod 103 having a diameter of 4 μm to $10^{-6}$ N or greater, it is necessary that the length of the microscopic rod 103 is set to 100 μm or less. Therefore, for extracting the separated sample piece 58 from an insulator sample where charge etc. are generated, it is safe that the length of the microscopic rod 103 is set to 25 times its diameter or less when the diameter is 4 82 m. Further, it has also been found that, using a microscopic rod having a diameter of 2 μm and a length of 100 μm with a strength less than the safety strength to a bending stress of $10^{-7}$ N or greater, about 50 samples can be extracted without being subjected to bending due to charge of an insulator etc. during sample preparation.

<Embodiment 7>

As a material of a microscopic rod having a property substantially equal to dependency (FIG. 15) of the bending stress shown in Embodiment 4 upon the length of the microscopic rod, there are, apart from tungsten, molybdenum, beryllium, nickel and tantalum. The microscopic rod 103 made of a material including at least one of them had a bending stress of about $10^{-7}$ N when a diameter was 2 μm and a length was 100 μm, and it was possible to extract about 50 samples without being subjected to bending caused by charge of an insulator etc. during sample preparation.

<Embodiment 8>

The microscopic rod 103 made of a material including at least one of palladium and osmium had a bending stress of about $10^{-7}$ N when a diameter was 2 μm and a length was 50 μm, and it was possible to extract about 25 samples without being subjected to bending caused by charge of an insulator etc. during sample preparation.

According to the present invention, using a mechanical probe formed at its tip with a microscopic rod in sample preparation, the life of the probe is improved to 10 times or more in terms of the number of sample preparation enabling times, further, a sample preparation time is shortened about ten minutes by eliminating the probe restoration operation upon sample extraction, and simultaneously, the reliability of sample preparation is improved correspondingly to the elimination of the probe restoration operation and the reduction in number of times of the probe replacement.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A microfabrication apparatus comprising:
   a charged particle gun;
   a lens for condensing a charged particle beam emitted from said charged particle gun;
   a deflector;
   a detector for detecting a secondary particle from a sample upon irradiation of said charged particle beam onto said sample;
   a specimen stage for retaining thereon said sample;
   a specimen-stage position controller for controlling a position of said specimen stage;
   a mechanical probe to be connected with a microscopic rod at its tip; and
   said microscopic rod wherein a mean area of sections at arbitrary three points of a central portion thereof excluding its tip and root is set to 1 $nm^2$ to 100 $μm^2$, and a length of said central portion is set to 20 to 300 times the shortest diameter of said sections.

2. A microfabrication apparatus according to claim 1, wherein a mean value of thicknesses of said microscopic rod at said arbitrary three points of said central portion is set to 1 to 10 μm, and the length of said central portion is set to 50 to 300 μm.

3. A microfabrication apparatus according to claim 1, wherein a mean value of thicknesses of said microscopic rod at said arbitrary three points of said central portion is set to 1 nm to 10 μm, and the length of said central portion is set to 20 to 300 times said thickness mean value.

4. A microfabrication apparatus according to claim 1, whereina material of said microscopic rod includes at least one selected from the group consisting of tungsten, molybdenum, beryllium, nickel, tantalum, palladium, and osmium.

5. A microfabrication method for use with a charged particle gun, a lens for condensing a charged particle beam emitted from said charged particle gun, a deflector, a detector for detecting a secondary particle from a sample 8 upon irradiation of said charged particle beam onto said sample, a specimen stage for retaining thereon said sample, a specimen-stage position controller for controlling a position of said specimen stage, and a mechanical probe having a microscopic rod at its tip, said microfabrication method comprising the steps of:
   (a) contacting the tip of said microscopic rod and a first sample to each other;
   (b) fixing together the tip of said microscopic rod and said first sample;
   (c) moving said first sample along with said microscopic rod;
   (d) cutting said microscopic rod at a root-side portion thereof near a fixing portion so as to separate said microscopic rod and said first sample from each other;
   (e) contacting the tip of said microscopic rod after cutting with a second sample;

(f) fixing together the tip of said microscopic rod and said second sample;

(g) moving said second sample along with said microscopic rod;

(h) cutting said microscopic rod at a root-side portion thereof near a fixing portion so as to separate said microscopic rod and said second sample from each other; and (i) repeating the steps (e) to (h).

6. A microfabrication method according to claim 5, wherein said steps (a) to (h) are repeated plural times, thereby to extract 10 or more samples, 25 or more samples, or 50 or more samples.

7. A microfabrication method according to claim 5, wherein a mean area of sections at arbitrary three points of a central portion of said microscopic rod excluding its tip and root is set to 1 nm$^2$ to 100 $\mu$m$^2$, and a length of said central portion is set to 20 to 300 times the shortest diameter of said sections.

8. A microfabrication method according to claim 5, wherein a mean value of thicknesses at arbitrary three points of a central portion of said microscopic rod excluding its tip and root is set to 1 to 10 $\mu$m, and the length of said central portion is set to 50 to 300 $\mu$m.

9. A microfabrication method according to claim 5, wherein a mean value of thicknesses at arbitrary three points of a central portion of said microscopic rod excluding its tip and root is set to 1 nm to 10 $\mu$m, and the length of said central portion is set to 20 to 300 times said thickness mean value.

* * * * *